United States Patent [19]

Burley et al.

[11] Patent Number: 4,995,045
[45] Date of Patent: Feb. 19, 1991

[54] LASER CONTROL CIRCUIT

[75] Inventors: Gregory S. Burley, Mississauga; Kim B. Roberts, Kanata, both of Canada

[73] Assignee: Northern Telecom Limited, Montreal, Canada

[21] Appl. No.: 473,513

[22] Filed: Feb. 1, 1990

[51] Int. Cl.$^5$ .............................................. H01S 3/00
[52] U.S. Cl. ...................................... 372/38; 372/33; 372/31
[58] Field of Search ....................... 372/29, 31, 33, 38, 372/26; 455/611, 613, 618

[56] References Cited

U.S. PATENT DOCUMENTS

| | | | |
|---|---|---|---|
| 3,946,335 | 2/1975 | De Loach, Jr. et al. | 372/38 |
| 4,009,385 | 2/1977 | Sell | 372/31 |
| 4,237,427 | 12/1980 | Holland | 372/38 |
| 4,292,606 | 9/1981 | Trimmel | 372/29 |
| 4,385,387 | 5/1983 | Trimmel | 372/29 |
| 4,504,976 | 3/1985 | Beaudet | 372/31 |
| 4,677,632 | 6/1987 | Lisco et al. | 372/38 |
| 4,744,087 | 5/1988 | Nicia | 372/38 |

FOREIGN PATENT DOCUMENTS 60-91687 5/1985 Japan ........................................ 372/31

OTHER PUBLICATIONS

Chen, F. S., *Electronics Letters*, "Simultaneous Feedback Control of Bias and Modulation Currents for Injection Lasers", Jan. 3rd, 1980, vol. 16, No. 1, pp. 7-8.

*Primary Examiner*—Frank Gonzalez
*Assistant Examiner*—Susan S. Morse
*Attorney, Agent, or Firm*—Dallas F. Smith; R. John Haley

[57] ABSTRACT

A laser diode control circuit maintains a desired average output power of the laser diode by detecting the optical output, amplifying the detected output, and controlling a bias current of the laser diode accordingly. A pilot tone is combined with the detected output and amplified therewith, and the amplified level of the tone is detected and used to control a modulation current for the laser diode. In one described arrangement the laser diode is controlled to have a high extinction ratio with the bias current at the knee of the diode's characteristic curve, and in another arrangement a lower extinction ratio is provided with the bias current above the knee.

9 Claims, 3 Drawing Sheets 4,995,045

LASER CONTROL CIRCUIT

This invention relates to laser diode control circuits, and to a method of controlling a laser diode.

As is well known, the characteristic curve (optical power versus current) of a laser diode, for example as used as a light source in an optical transmission system, has a non-linear bend or knee below a substantially linear region in which it is normally desired that the laser diode be operated. Accordingly, it is usual to provide a laser diode with a bias current to bias the laser diode for operation in the linear region above the knee. An insufficient bias current can lead to non-linear operation of the laser diode, and an excessive bias current can lead to excessive power dissipation in the laser diode.

A recognized problem with laser diodes is that, with aging and temperature variations, the characteristic curve of a laser diode can change over time, especially in respect of the position of the knee (and hence the optimum bias current) and the slope of the linear region above the knee. Accordingly, it has been recognized that adaptive control circuitry is required for a laser diode, at least for setting the bias current. For example, in Trimmel U.S. Pat. No. 4,385,387 issued May 24, 1983 and entitled "Preconduction Current Control of Laser Diodes" there is described an arrangement in which the bias current (referred to as preconduction current) is controlled via a feedback loop into which a sinusoidal pilot signal is inserted so that the bias current includes a sinusoidal component. In the feedback loop, a part of the sinusoidal signal component in the laser diode output is detected during a selected time interval of the sinusoid, and this is rectified and compared with a threshold level to control the bias current.

While such a known arrangement provides a level of adaptive control, it is relatively complicated and does not compensate fully for changes in the laser diode's characteristic curve, in particular changes in the slope of the linear region of the characteristic curve.

An object of this invention, therefore, is to provide an improved laser diode control circuit.

According to one aspect of this invention there is provided a laser diode control circuit comprising: first control means, including an amplifier, for controlling a bias current for a laser diode; means for supplying a pilot signal to an input of the amplifier; and second control means responsive to a level of the pilot signal at an output of the amplifier for controlling a modulation current of the laser diode.

The control circuit thus includes two interconnected control loops, which control the laser bias current and modulation current respectively. Because the pilot signal is amplified in the control loop for controlling the bias current, the level of the pilot signal at the output of the amplifier for a given average power output of the laser diode is representative of the slope of the linear region of the laser diode's characteristic curve. This is used in accordance with the invention in the second control loop to control the modulation current for the laser diode. The two control loops thus interact to enable the laser diode to be operated in a desired part of the linear region of the characteristic curve, with this operation being adaptively maintained by the control loops to compensate for changes in the characteristic curve due to aging, temperature changes and so on.

Preferably the second control means comprises means for detecting the pilot signal to produce an output voltage, representing the level of the pilot signal at the output of the amplifier, for comparison with a reference voltage. The pilot signal can conveniently comprise a pilot tone, and the means for detecting the pilot signal can comprise a synchronous detector and/or a low-pass filter.

In embodiments of the invention for operation of the laser diode with a relatively high extinction ratio, corresponding to a bias current substantially at the knee of the characteristic curve, the second control means preferably further comprises means for comparing the output voltage with a reference voltage and means for controlling the modulation current in dependence upon the comparison.

In embodiments of the invention for operation of the laser diode with a relatively low extinction ratio, corresponding to a bias current significantly above the knee of the characteristic curve, preferably the second control means further comprises means for amplifying the output voltage, means for controlling the modulation current in dependence upon the amplified output voltage, and means responsive to the output voltage and to a reference voltage for producing a further voltage to which the means for controlling the modulation current is also responsive to establish operation of the laser diode in a desired operating region.

According to another aspect of this invention there is provided a method of controlling a laser diode comprising the steps of: detecting an output of the laser diode; combining the detected output with a pilot signal and amplifying the combined signal to produce an amplified signal; controlling a bias current of the laser diode in dependence upon the amplified signal; and controlling a modulation current for the laser diode in dependence upon a level of the pilot signal in the amplified signal.

Preferably the step of controlling the modulation current comprises the steps of: detecting the level of the pilot signal in the amplified signal; and comparing the detected level of the pilot signal with a reference level.

The invention will be further understood from the following description with reference to the accompanying drawings, in which.

Figure 1:
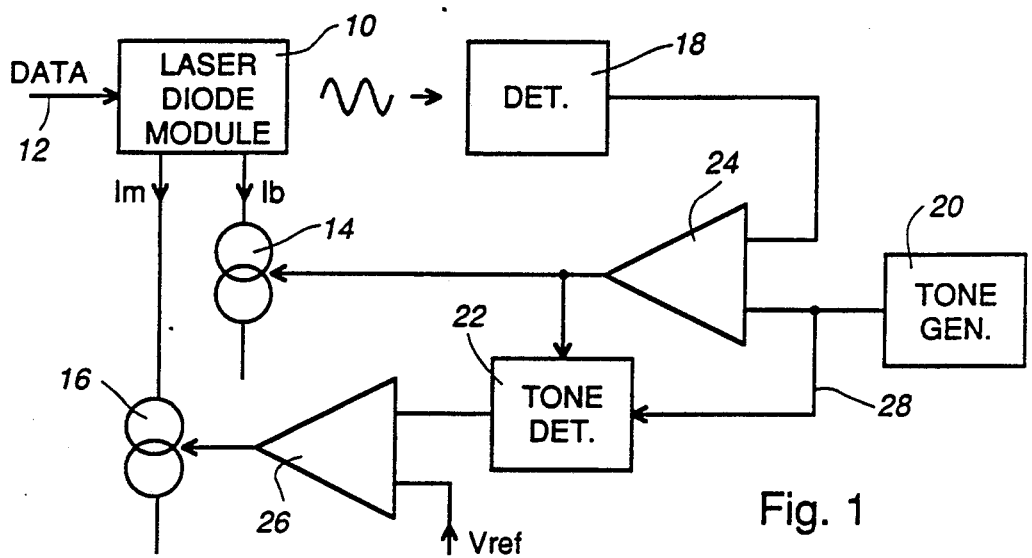
FIG. 1 illustrates in block diagrammatic form a laser control circuit in accordance with an embodiment of the invention.

Referring to FIG. 1, there is illustrated in block diagram form a control circuit for a laser diode module 10 including a laser diode which is modulated in accordance with data supplied via a line 12 to produce a modulated optical signal for transmission of the data via an optical transmission path, not shown. The laser diode module 10 conducts currents Ib and Im which are determined by controlled current sinks 14 and 16 respectively of the control circuit. The current Ib is a bias current for biasing the laser diode to operate in the substantially linear region above the knee of its characteristic curve, and the current Im is a modulation current which is conducted via the laser diode or not in dependence upon the data thereby to modulate the optical signal produced by the laser diode.

In addition to the controlled current devices 14 and 16, the control circuit includes a pin diode detector 18 for detecting a back-facet component of the optical signal produced by the laser diode, a pilot tone generator 20, a pilot tone detector 22, and differential amplifiers 24 and 26.

The detector 18, amplifier 24, and controlled current sink 14 form a first feedback loop which controls the laser diode bias current Ib to stabilize the average power of the laser diode. To this end, the output of the detector 18 is amplified by the amplifier 24, whose output is used to control the current sink 14 and hence the current Ib. The tone generator 20, tone detector 22, amplifier 26, and controlled current sink 16 form a second feedback loop which controls the laser diode modulation current Im. To this end, the output of the tone generator 20 is subtracted from the detector 18 output in the amplifier 24, the tone detector 22 detects the level of the tone present at the output of the amplifier 24, and the amplifier 26 acts as a comparator to compare the detected level of the tone with a reference voltage Vref and to control the current sink 16 accordingly. The tone detector 22 is desirably a synchronous detector, which accordingly is also supplied with the pilot tone from the generator 20 via a line 28.

The operation of the control circuit is explained below with reference to FIGS. 2a and 2b, which illustrate the characteristic curve of the laser diode shown on a graph of laser diode output power plotted against laser diode current, together with the form of the modulated optical output signal, which is detected by the detector 18 as well as being transmitted on the optical transmission path. The characteristic curve has a substantially linear region 40 above a threshold or knee 42. The modulated optical output signal has a signal envelope 44 which exhibits the sinusoidal variation of the pilot tone signal, and high speed data transitions 46 which occur at the bit rate of the modulating data. The laser diode current is Ib for binary zero data bits and Ib + Im for binary one data bits.

Figure 2A:
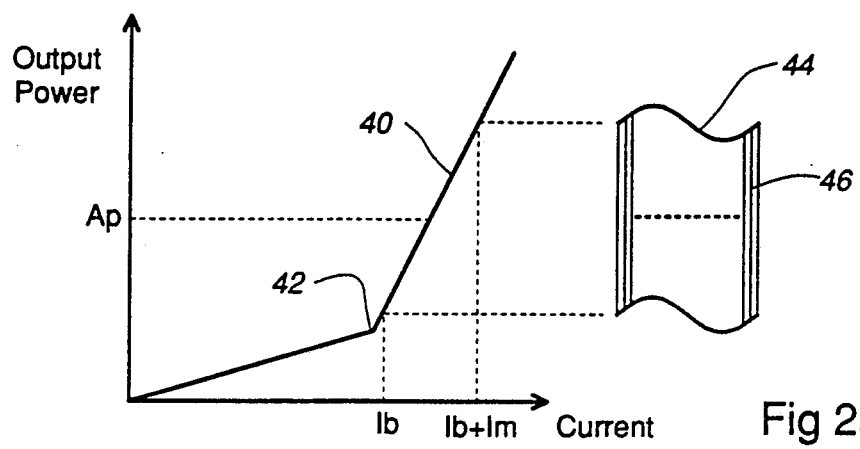
FIGS. 2a and 2b are diagrams illustrating operation of the laser control circuit of FIG. 1.
Figure 2B:
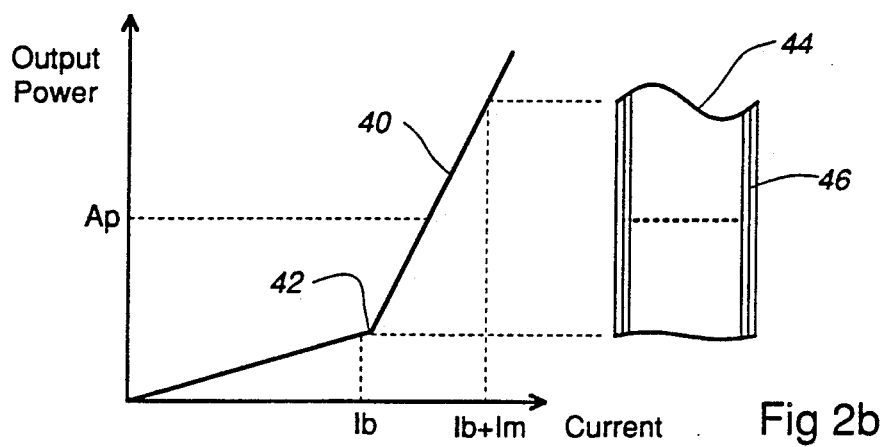

FIGS. 2a and 2b illustrate operation with the bias current Ib respectively above and below the knee 42 of the characteristic curve, with the same average output power Ap from the laser diode. The average power Ap is the average of the output powers of the laser diode passing the currents Ib and Ib + Im respectively, corresponding to the binary zero and one data bits respectively. FIGS. 2a and 2b relate to operation with respectively lower and higher levels of the reference voltage Vref.

In FIGS. 2a, with a relatively high bias current Ib and a relatively low modulation current Im to provide the average power level Ap, the laser diode operates entirely in the linear region 40 so that the sinusoidal signal envelope of the pilot tone appears in the laser output for both binary ones and binary zeroes of the data. A certain level of this tone, dependent upon the laser diode efficiency (slope of the linear region 40) and the gain of the amplifier 24, is produced at the output of the amplifier 24 and is detected by the detector 22 to determine the modulation current Im.

In FIG. 2b, with a relatively lower bias current Ib and a relatively higher modulation current Im to provide the same average power level Ap, the laser diode operates in the linear region 40 only for binary ones of the data, operating below the knee 42 for binary zeroes of the data so that the sinusoidal signal envelope of the pilot tone is greatly reduced in the modulated signal output for such binary zeroes, as shown in FIG. 2b. Accordingly, a much greater level of this tone is produced at the output of the amplifier 24 and is detected by the detector 22 to determine the higher modulation current Im.

It can be seen that, for a desired average power Ap, the level of the reference voltage Vref determines the value of the modulation current Im and hence determines the position of the data zero level (bias current Ib) relative to the knee 42. For example, if the laser efficiency decreases, so that the slope of the substantially linear region 40 of the characteristic curve becomes less steep, then the circuit causes the modulation current Im to increase to maintain a constant modulation depth for the pilot tone. Viewed alternatively, if Vref is increased to increase Im, then the control loop comprising the components 18, 24, and 14 decreases Ib to maintain the same average power Ap. Thus the level of the reference voltage Vref can be set to position the bias current Ib precisely with respect to the knee 42, for example exactly at the knee 42 to provide the greatest average power Ap for a maximum peak power of the laser diode.

Figure 3:
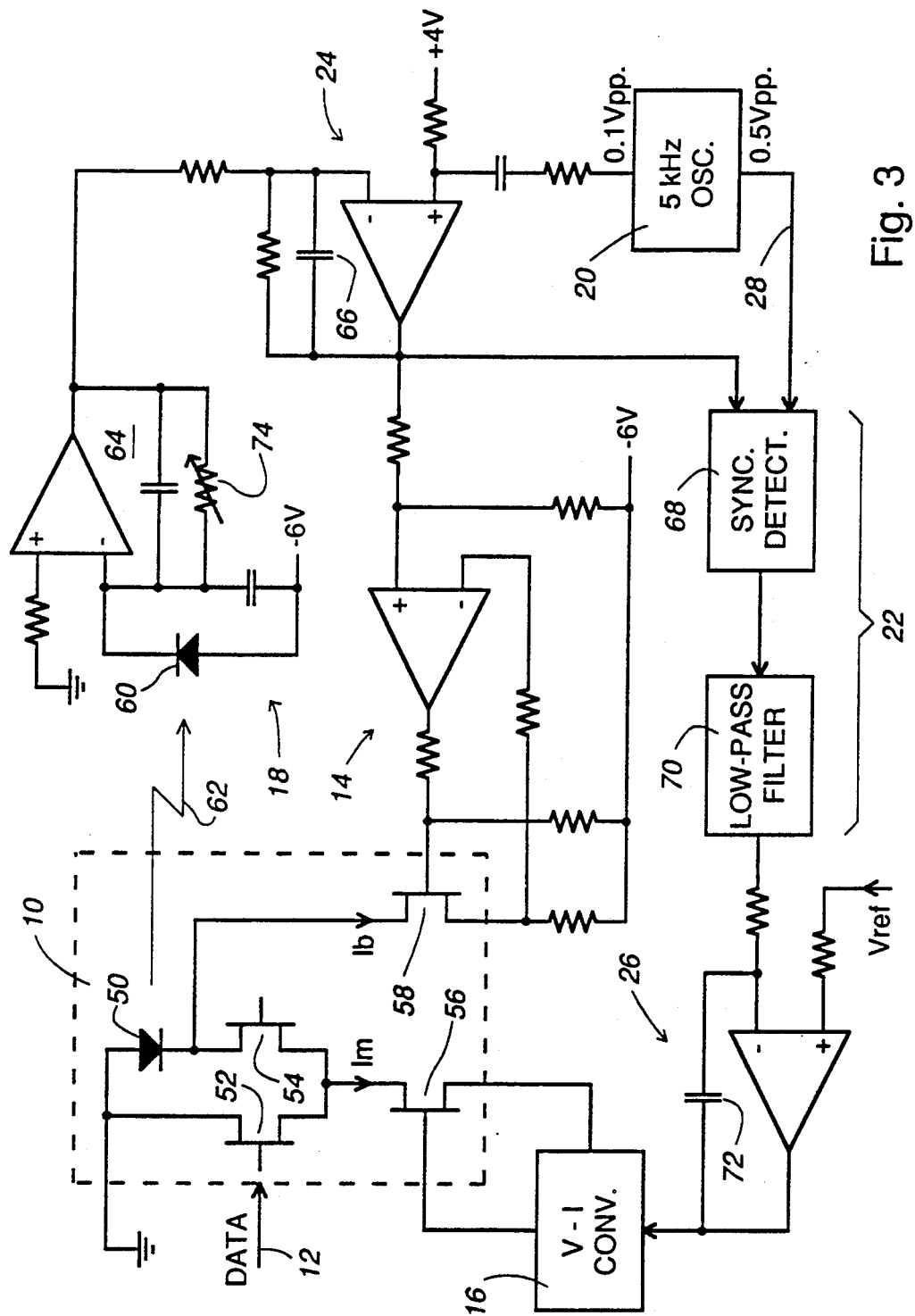
FIG. 3 illustrates a circuit diagram of an embodiment of the laser control circuit of FIG. 1.

FIG. 3 illustrates the control circuit of FIG. 1 in greater detail, similar references being used to denote corresponding components. As illustrated in FIG. 3, the laser diode module 10 comprises a laser diode 40 which is connected in a controlled path of two differentially-connected FETs (field effect transistors) 52, 54 which are differentially driven by the data signal on the line 12. A further FET 56 controls the modulation current Im which is passed by whichever one of the FETs 52, 54 which is currently conducting, and a further FET 58 controls the bias current Ib which the laser diode 50 continuously conducts. The controlled current sink 14 is constituted by a 5 mA/V voltage-to-current converter circuit details and connections of which are illustrated in FIG. 3, and the controlled current sink is constituted by a similar converter circuit (V-1 CONV.) which is simply shown as a block in FIG. 3.

The detector 18 comprises a pin diode 60, arranged to receive back-facet light from the laser diode 50 as indicated by an arrow 62, and a transimpedance amplifier 64. The differential amplifier 24 incorporates a loop filter function by the provision of a capacitor 66 in a negative feedback path, and is supplied with a O.1 Vpp (peak-to-peak) amplitude signal at a frequency of 5 kHz from an oscillator which constitutes the pilot tone generator 20, providing a very small modulation depth of less than 5%. The pilot tone detector 22 is constituted by a synchronous detector 68, which is supplied with the pilot tone at a higher, O.5 Vpp, amplitude via the line 28 and with the output of the amplifier 24 and can be constituted by a type NE602 integrated circuit, and a following low-pass filter 70. The amplifier 26 is supplied with the output of the low-pass filter 70 and with the reference voltage Vref which is manually set as described above, and includes an integrating capacitor 72 in a negative feedback path.

Figure 4:
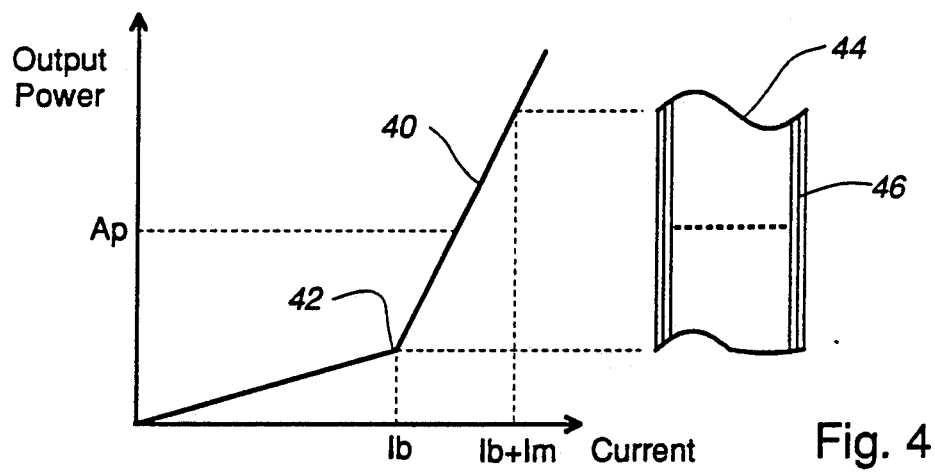
FIG. 4 is a diagram illustrating preferred operation of the laser control circuit of FIGS. 1 and 3.

In the control circuit of FIG. 3, the gain of the transimpedance amplifier 64 is varied, by adjusting the resistance of a variable resistor 74 in a negative feedback path of this amplifier 64, to set a desired average output power of the laser diode. The reference voltage Vref is then set to provide a desired output power envelope corresponding to operation with the bias current Ib at the knee 42 of the characteristic curve, for example as shown in FIG. 4. The illustration in FIG. 4 is similar to those of FIGS. 2a and 2b, except for the form of the pilot tone envelope 44 for the binary zero data bits.

The control circuit described above is particularly convenient for use with data bit rates of the order of 200 Mb/s or more and with laser diodes operating with a relatively high extinction ratio (i.e. ratio of output powers for binary one and binary zero data bits). For operation with relatively lower extinction ratios, as may be necessary or desirable for optical signal wavelengths of about 1550 nm at which optical fibers are dispersive so that laser diode "chirp" or wavelength variation must be reduced, a modified form of the control circuit as described below with reference to FIGS. 5 and 6 can be used.

Figure 5:
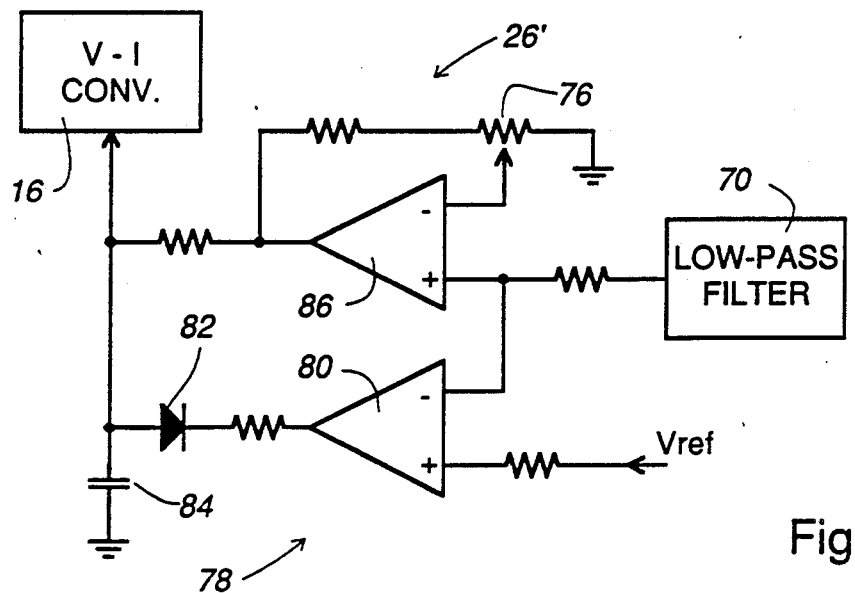
FIG. 5 illustrates a modification of part of the circuit diagram of FIG. 3.

In the modified form of the control circuit, the integrating amplifier 26 of the circuit of FIG. 3 is replaced by a non-integrating amplifier circuit 26' as illustrated in FIG. 5, with a variable gain which is set by a variable resistor 76, and an initialization or anti-latching amplifier circuit 78 comprising a differential amplifier 80, a diode 82, and a capacitor 84. The output of the low-pass filter 70 is coupled to a non-inverting input of a differential amplifier 86 of the circuit 26' and to an inverting input of the amplifier 80, whose non-inverting input is supplied with the reference voltage Vref. The input of the voltage-to-current converter 16 is coupled to the output of the amplifier 86; to the output of the amplifier 80 via the diode 82, and via the capacitor 84 to ground. The remainder of the control circuit is as shown in FIG. 3.

Figure 6:
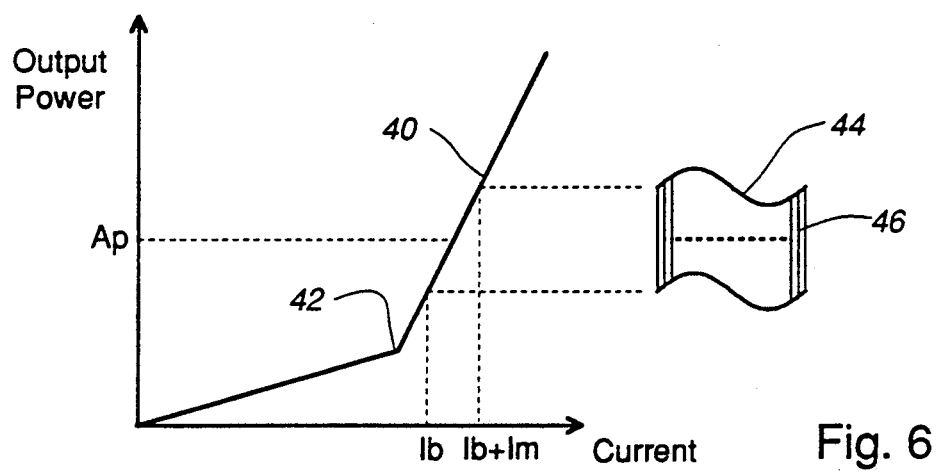
FIG. 6 is a diagram illustrating operation of the laser control circuit modified as shown in FIG. 4.

The modified form of the control circuit operates as illustrated in FIG. 6, with an average power Ap set as already described and a modulation current Im set by the variable resistor 76 to provide a desired extinction ratio. In FIG. 6, and also in FIGS. 2a, 2b, and 4, the pilot tone signal envelope is shown greatly exaggerated for clarity; the modulation depth is for example less than 5% as already mentioned, and typically may be about 2%. In normal operation as illustrated in FIG. 6, the circuit 78 serves no function because the output of the amplifier 80 reverse biasses the diode 82. However, on initialization or in abnormal operating conditions the circuit 78 is necessary to establish or maintain this operation on the linear region 40 of the characteristic curve as illustrated in FIG. 6.

Although particular embodiments of the invention have been described above, numerous modifications, variations, and adaptations may be made thereto without departing from the scope of the invention as defined in the claims. For example, the detector 18 can be arranged to detect a portion of the light transmitted by the laser diode rather than a back-facet component. The invention is also applicable to other than binary modulation of the laser diode; for example it could be applied to ternary or analogue modulation schemes as long as there is a minimum modulation level which occurs commonly, corresponding to the binary zero level described above.

We claim:

1. A laser diode control circuit comprising:
   first control means, including an amplifier, having an input and an output, for controlling a bias current for a laser diode;
   means for supplying a pilot signal to the input of the amplifier; and
   second control means connected to the output of the amplifier and responsive to an amplified level of the pilot signal at the output of the amplifier for controlling a modulation current of the laser diode.

2. A control circuit as claimed in claim 1 wherein the second control means comprises detector means for detecting the amplified level of the pilot signal and producing an output voltage representing the amplified level of the pilot signal, for comparison with a reference voltage.

3. A control circuit as claimed in claim 2 wherein the pilot signal comprises a pilot tone and the detector means for detecting the pilot signal comprises a synchronous detector.

4. A control circuit as claimed in claim 2 wherein the detector means for detecting the pilot signal comprises a low-pass filter.

5. A control circuit as claimed in claim 2 wherein the second control means further comprises means for comparing the output voltage, from the detector means, with a reference voltage to provide a control voltage and means for controlling the modulation current responsive to the control voltage.

6. A control circuit as claimed in claim 2 wherein the second control means further comprises means for amplifying the output voltage to provide a control voltage and means for controlling the modulation current responsive to the control voltage.

7. A control circuit as claimed in claim 6 wherein the second control means further comprises means responsive to the output voltage and to a reference voltage for producing a further control voltage to which the means for controlling the modulation current is also responsive.

8. A method of controlling a laser diode comprising the steps of:
   detecting an output of the laser diode;
   providing a pilot signal;
   combining the detected output with the pilot signal and amplifying the combined signal to produce an amplified signal having, as a component thereof, an amplified level of the pilot signal;
   controlling a bias current of the laser diode in dependence upon the amplified signal; and
   controlling a modulation current for the laser diode in dependence upon the amplified level of the pilot signal in the amplified signal.

9. A method as claimed in claim 8 wherein the step of controlling the modulation current comprises the steps of:
   detecting the amplified level of the pilot signal in the amplified signal; and
   comparing the detected level of the pilot signal with a reference level.

* * * * *